United States Patent
Nielsen

(10) Patent No.: US 9,673,767 B2
(45) Date of Patent: Jun. 6, 2017

(54) MEMS MICROPHONE AND METHOD OF OPERATING THE MEMS MICROPHONE

(75) Inventor: Ivan Riis Nielsen, Stenløse (DK)

(73) Assignee: TDK Corporation, Tokyo (JP)

( * ) Notice: Subject to any disclaimer, the term of this patent is extended or adjusted under 35 U.S.C. 154(b) by 46 days.

(21) Appl. No.: 14/420,324

(22) PCT Filed: Apr. 10, 2012

(86) PCT No.: PCT/EP2012/065764
§ 371 (c)(1),
(2), (4) Date: Apr. 7, 2015

(87) PCT Pub. No.: WO2014/023363
PCT Pub. Date: Feb. 13, 2014

(65) Prior Publication Data
US 2015/0318833 A1    Nov. 5, 2015

(51) Int. Cl.
| | |
|---|---|
| *H04R 5/00* | (2006.01) |
| *H03G 3/20* | (2006.01) |
| *H04R 3/00* | (2006.01) |
| *H04R 3/06* | (2006.01) |
| *H03G 3/30* | (2006.01) |
| *H04R 29/00* | (2006.01) |

(52) U.S. Cl.
CPC ............. *H03G 3/20* (2013.01); *H03G 3/3005* (2013.01); *H04R 3/00* (2013.01); *H04R 3/06* (2013.01); *H04R 3/007* (2013.01); *H04R 29/004* (2013.01); *H04R 2201/003* (2013.01); *H04R 2430/01* (2013.01)

(58) Field of Classification Search
USPC ... 381/26, 91, 92, 107, 111, 113, 71.7, 94.9, 381/321, 411
See application file for complete search history.

(56) References Cited

U.S. PATENT DOCUMENTS

2009/0316916 A1    12/2009  Haila et al. ................... 381/57

FOREIGN PATENT DOCUMENTS

| EP | 1 690 437 B1 | 1/2011 | ............. H04M 3/04 |
| EP | 1690437 | * 1/2011 | ............. H04M 3/04 |
| EP | 2 485 395 A1 | 8/2012 | ............. H03G 7/00 |

(Continued)

OTHER PUBLICATIONS

International Search Report for PCT Application No. PCT/US2012/065764 dated Mar. 28, 2013 (2 pages).

(Continued)

*Primary Examiner* — Yosef K Laekemariam
(74) *Attorney, Agent, or Firm* — Nixon Peabody LLP

(57) ABSTRACT

The present invention concerns a MEMS Microphone (1) comprising, a transducer element (2) for providing an electrical signal, a first part (3) for receiving the electrical signal from the transducer element (2) and for providing a processed signal, a second part (4) for receiving the processed signal from the first part (3) and for providing an output signal of the MEMS microphone (1), and a gain control unit (5) that is enabled to adjust a gain setting of the first part (3) and to adjust a gain setting of the second part (4). Further, another aspect of the present invention concerns a method of operating said MEMS microphone (1) comprising the step of adjusting a gain setting of the first part (3) and adjusting a gain setting of the second part (4).

19 Claims, 2 Drawing Sheets

(56) References Cited

FOREIGN PATENT DOCUMENTS

| JP | 56-020436 A | 2/1981 | |
|---|---|---|---|
| WO | WO 2010/112414 | * 10/2007 | ............... H03G 3/30 |

OTHER PUBLICATIONS

International Preliminary Report on Patentability for PCT Application No. PCT/US2012/065764 dated Feb. 19, 2015 (7 pages).
Partial Translation of Examination Report of corresponding Japanese Patent Application No. JP 2015525752.

* cited by examiner

MEMS MICROPHONE AND METHOD OF OPERATING THE MEMS MICROPHONE

CROSS-REFERENCE TO RELATED APPLICATIONS

This application is a U.S. National Stage of International Application No. PCT/EP2012/065764, filed Aug. 10, 2012, all of which is incorporated herein by reference in its entirety.

The present invention concerns an MEMS microphone and a method of operating the MEMS microphone.

Microphones for mobile devices are expected to perform in a wide variety of ambient conditions. Therefore, a high Signal-to-Noise ratio and a high sound pressure level are required. The sound pressure level gives the strongest acoustic input signal that the microphone can accurately reproduce without an overflow of the transducer element or the front-end circuit. Further requirements for MEMS microphones are minimizing the power consumption, minimizing the required supply voltage and minimizing the size of the MEMS microphone.

It is an object of the present invention to provide a MEMS microphone wherein at least some of these contradicting objectives are solved, i.e. to provide a MEMS microphone providing a good Signal-to-Noise ratio while maintaining a high sound pressure level. Moreover, it is an object of the present invention to provide a method of operating such a MEMS microphone.

This object may be achieved by a MEMS microphone according to present claim 1. Further, the object may be achieved by a method of operating the MEMS microphone according to the independent claim. Further features, advantageous embodiments and expediencies are subject-matter of the dependent claims.

According to one aspect, a MEMS microphone comprises a transducer element for providing an electrical signal, a first part for receiving the electrical signal from the transducer element and for providing a processed signal, a second part for receiving the processed signal from the first part and for providing an output signal of the MEMS microphone and a gain control unit that is enabled to adjust the gain setting of the first part and to adjust the gain setting of the second part.

The term "part" may refer to a stage of the MEMS microphone. A part may also be a section of the MEMS microphone.

In particular, a part may be a circuit. Accordingly, a part may comprise electrical components. In particular, a part may comprise linear elements and/or other components, e.g. a Sigma-Delta Modulator. Further, a part may comprise a main path connecting an input port and an output port wherein at least some of the components are arranged along the main path.

Accordingly, an input signal may be fed to the input port of the main path. Further, the signal may be processed by the components. The processed signal may be provided at the output port of the part. The processing of the signal carried out by the components of the part may comprise at least one of an amplification of the signal, a filtering of the signal and a conversion from an analogue signal to a digital signal or vice versa.

However, a part may also be a circuit being free from components. Alternatively, a part may be a sub-part of a circuit.

In a preferred embodiment, the MEMS microphone may comprise a signal processing circuit which is composed of only the first part, the second part and the gain control unit.

The signal processing unit may be adapted to receive the signal provided by the transducer element and to provide a processed output signal of the MEMS microphone. The processed output signal may be a single-bit digital signal that may be fed to a front-end circuit.

However, alternatively, the signal processing circuit of the MEMS microphone may also comprise further elements or parts apart from the first part, the second part and the gain control unit.

The first part may be a part adapted to receive an analog input signal and to provide a digital output signal. Accordingly, the processing of the electrical signal by the first part may comprise converting the analog electrical signal to a digital signal. Further, the processing of the electrical signal by the first part may comprise amplifying the electrical signal. The degree of the amplification may be defined by the adjustable gain setting of the first part.

The second part may be adapted to receive a digital input signal and to provide a digital output signal. Further, the second part may also be adapted to amplify the signal. Thereby, the degree of the amplification may be defined by the adjustable gain setting of the second part. The second part may also be adapted to convert a multi-bit digital signal into a single-bit digital signal.

In particular, the adjustable gain setting of the first part and the adjustable gain setting of the second part may be adjusted such that a linear input-output relationship of the MEMS microphone is established. Accordingly, the amplitude signal provided by the transducer element may be in a linear relationship to the amplitude of the output signal of the MEMS microphone.

In one embodiment, the gain control unit is enabled to adjust the gain setting of the first part reciprocally proportional to the adjustment of the gain setting of the second part. Accordingly, an adjustment of the gain setting of the first part is always compensated by a corresponding adjustment of the gain setting of the second part. Thereby the linear relationship between the signal provided by the transducer element and the output signal is ensured.

In particular, if a strong signal is detected, the gain setting of the first part may be reduced such that an overflow of the first part is prevented. Thereby, the gain setting may be adjusted such that a high sound pressure level, e.g. a sound pressure level up to 140 dB, is achieved.

Further, for signals having a small amplitude, the gain setting of the first part may be adjusted such that a sufficiently high Signal-to-Noise ratio is ensured also for signals having a small amplitude. In particular, the first part may be altered in its linearity range such that a good linearity is ensured for signals having a small amplitude. The linearity range of a part gives the frequency range for which the respective part is optimized in its linearity between input and output signal. As it is possible to amend the gain setting of the first part, the linearity range of the first part can be increased. Thereby, a good Signal-to-Noise ratio is achieved over a large range of signal amplitudes. In particular, a Signal-to-Noise ratio of more than 66 dB may be achieved while the MEMS microphone is able to tolerate a sound pressure level of 140 dB.

In one embodiment, the first part comprises an Analogue-to-Digital Sigma-Delta Modulator having an adjustable gain setting. In particular, the adjustment of the gain setting of the Analogue-to-Digital Sigma-Delta Modulator may comprise changing the full scale range of the Analogue-to-Digital Sigma-Delta Modulator. Accordingly, the full scale range of the Sigma-Delta Modulator may be adjusted either to weak signals having a small amplitude or to strong signals having a large amplitude. The full scale range of the Analogue-to-Digital Sigma-Delta Modulator gives the maximum amplitude the Analogue-to-Digital Sigma-Delta Modulator can present as an output signal. Every signal having an amplitude exceeding the full scale range is presented with all bits of the digital output signal equaling "1".

If a strong signal having a large amplitude is present, the full scale range of the Sigma-Delta Modulator is adjusted such that an overflow of the Sigma-Delta Modulator is prevented. For weak signals having a small amplitude, the full scale range is adjusted such that a large Signal-to-Noise ratio is ensured. Accordingly, it is possible to adjust the sensitivity of the Sigma-Delta Modulator according to the amplitude of the signal.

Furthermore, the first part may comprise a preamplifier. The preamplifier may have an adjustable gain setting. Further, additionally or alternatively to the preamplifier, the first part may comprise other linear elements.

The preamplifier may be arranged in series between the transducer element and the Analogue-to-Digital Sigma-Delta Modulator.

The second part may comprise a digital Sigma-Delta Modulator having an adjustable gain setting. In particular, the adjustment of the gain setting of the digital Sigma-Delta Modulator may comprise changing the full scale range of the digital Sigma-Delta Modulator.

In one embodiment, the transducer element is a differential transducer element for providing two electrical signals to the first part. The differential transducer element may comprise one displaceable diaphragm arranged between two backplates wherein a bias voltage is applied to the displaceable diaphragm. Alternatively, the differential transducer element may comprise two displaceable diaphragms and one backplate. Differential transducer elements provide two electrical signals thereby increasing the sensitivity and the reliability of the provided electrical signal. However, the invention is not restricted to MEMS microphones comprising differential transducer elements. Instead, a regular transducer element comprising a single displaceable diaphragm and a backplate may also be used.

In one embodiment, the gain control unit is enabled to monitor the amplitude of the processed signal provided by the first part and to adjust the gain setting of the first part and of the second part based on the monitored amplitude. Thereby, the gain control unit can deduce if the electrical signal received by the transducer element is a strong or a weak signal. In the case of a strong signal, the gain setting of the first part may be reduced in order to avoid an overflow or clipping of the first part. In the case of a weak signal the gain setting of the first part may be increased in order to allow for a good sensitivity and a good Signal-to-Noise ratio.

However, the gain setting of the second part may be treated reciprocally proportional to the gain setting of the first part such that a linear relationship between the acoustic input signal and the output signal of the MEMS microphone is ensured.

In one embodiment, the electrical signal provided by the transducer element is an analog signal and, further, the first part converts this signal such that the processed signal is a digital signal. The digital signal may either be a single-bit signal or a multi-bit signal. Further, the second part may be enabled to convert the processed signal provided by the first part into a digital single-bit signal. The front-end circuits connected to MEMS microphones in mobile devices typically expect single-bit input signals. Accordingly, the second part converting the signal into a single-bit signal ensures that the MEMS microphone is compatible with common front-end circuits.

A second aspect of the present invention concerns a method of operating the above-discussed MEMS microphone.

In particular, the method of operating the MEMS microphone concerns an MEMS microphone comprising all structural and functional features as discussed above. Accordingly, the MEMS microphone may also comprise all structural and functional features discussed with respect to the method in the following.

The method of operating a MEMS microphone concerns a MEMS microphone which comprises a transducer element for providing an electrical signal, a first part for receiving the electrical signal from the transducer element and for providing a processed signal, a second part for receiving the processed signal from the first part and for providing an output signal of the MEMS microphone and a gain control unit. The method comprises a step of adjusting the gain setting of the first part and adjusting the gain setting of the second part.

The setting of the first part may be adjusted by the gain control unit reciprocally proportional to the adjustment of the gain setting of the second part. Thereby, any adjustment carried out in the first part may be compensated by the corresponding reciprocally proportional adjustment in the second part. Thereby a linear relationship between the input and the output signal of the MEMS microphone is ensured.

In one embodiment, the method may comprise a step wherein the gain control unit monitors the amplitude of the processed signal provided by the first part and adjusts the gain settings of the first and of the second part based on the amplitude of the processed signal provided by the first part.

From this amplitude it may be deduced whether the acoustical signal received by the transducer element is a weak signal or a strong signal. Accordingly, the gain settings and the full scale ranges of the first and of the second part may be adjusted in order to realize an ideal Signal-to-Noise ratio while not reducing the maximum sound pressure level of the microphone.

In one embodiment, if the amplitude exceeds a first threshold value, the gain control unit decreases the gain setting of the first part and increases the gain setting of the second part. The amplitude exceeding the first threshold value may imply that the acoustic signal received by the transducer element is getting stronger. Accordingly, the gain control unit may trigger adjustments before an overflow of the microphone occurs.

In particular, if the amplitude exceeds the first threshold value, the gain setting may be amended instantaneously, i.e. without waiting for a predetermined period of time. If the amplitude exceeds the first threshold value, an overflow of the first part may be approaching such that the gain setting of the first part is preferably reduced instantaneously.

In one embodiment, if the amplitude remains below a second threshold value for a given period of time, the gain control unit may increase the gain settings of the first part and decrease the gain settings of the second part.

The amplitude remaining below a second threshold value for a given period of time may imply that the acoustic signal received by the transducer element is weakened. Accordingly, the gain control unit adjusts the gain settings and the full scale range such that the Signal-to-Noise ratio is not deteriorated.

For this purpose, the gain control unit may comprise a timer. The given period of time measured by the timer should be kept higher than around half the period of the minimum frequency signal. Otherwise, unwanted gain adjustments during zero-crossing of a minimum frequency signal may occur. The given period of time may be in the range of 1 to 100 milliseconds, preferably in the range of 10 to 50 milliseconds.

Further features, refinements and expediencies become apparent from the following description of the exemplary embodiments in connection with the figures.

FIG. 1 schematically shows a block diagram of a MEMS microphone.

Figure 1:
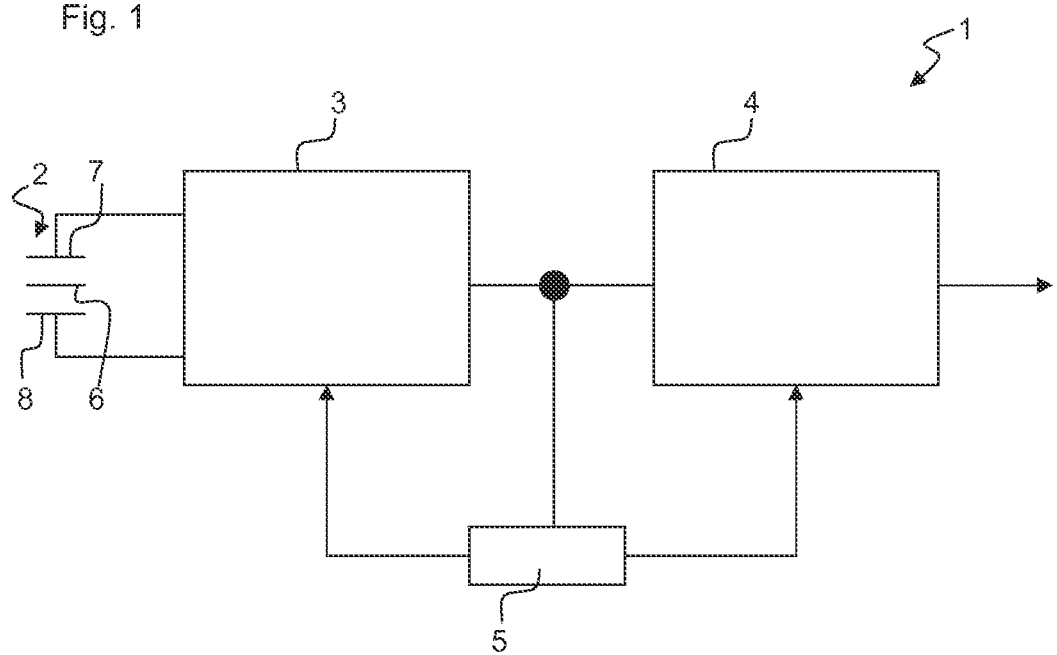

FIG. 1 schematically shows a block diagram of a MEMS microphone 1. The MEMS microphone 1 comprises a transducer element 2, a first part 3, a second part 4 and a gain control unit 5.

The transducer element 2 is adapted to convert acoustical signals into electrical signals. The MEMS microphone 1 shown in FIG. 1 comprises a differential transducer element comprising a displaceable diaphragm 6, a first backplate 7 and a second backplate 8. The displaceable diaphragm 6 is arranged between the two backplates 7, 8 and a bias voltage is applied to the diaphragm 6. Accordingly, this transducer element 2 provides two electrical signals. Each of the electrical signals corresponds to the capacity between the displaceable diaphragm 6 and the first or, respectively, the second backplate 7, 8.

Further, the first part 3, the second part 4 and the gain control unit 5 form a signal processing circuit of the MEMS microphone 1. The signal processing circuit is adapted to process the signal provided by the transducer element 2 and to provide an output signal of the MEMS microphone 1, preferably to provide a single-bit digital signal as an output signal.

In the embodiment shown in FIG. 1, the signal processing circuit is composed only of the first part 3, the second part 4 and the gain control unit 5. However, in alternative embodiments, the signal processing circuit may further comprise other parts or components.

The two electrical signals provided by the transducer element 2 are fed to the first part 3. However, the invention is not limited to MEMS microphones 1 comprising differential transducer elements. Alternatively, the MEMS microphone 1 may comprise a transducer element 3 having only one displaceable diaphragm 6 and one backplate 7 and, therefore, providing only one electrical signal to the first part 3.

In particular, the first and the second part 3, 4 may be circuits. Accordingly, each part 3, 4 may comprise electrical components. In particular, each part 3, 4 may comprise linear elements and/or other components, e.g. a Sigma-Delta Modulator. Further, each part 3, 4 may comprise a main path connecting an input port and an output port wherein at least some of the components are arranged along the main path.

Accordingly, an input signal may be fed to the input port of the main path. Further, the signal may be processed by the components. The processed signal may be provided at the output port of the part 3, 4. The processing of the signal carried out by the components of the part 3, 4 may comprise at least one of an amplification of the signal, a filtering of the signal and a conversion from an analogue signal to a digital signal or vice versa.

However, a part 3, 4 may also be a circuit being free from components. Alternatively, a part 3, 4 may be a sub-part of a circuit.

The first part 3 is adapted to process the electrical signals provided by the transducer element 2. The processing of the electrical signals may correspond to a conversion from analog signals into digital signals. The processing of the signals may correspond to an amplification of the amplitude of the signal. In particular, a parameter A1 describes a gain setting of the first part 3. The gain setting A1 may correspond to the amplification factor by which the first part 3 amplifies the signal received from the transducer element 2. The gain setting A1 may also correspond to setting a linearity range of the first part 3.

The processed signal provided by the first part 3 is fed to the second part 4 as an input signal. The second part 4 processes the processed signal again and provides an output signal of the MEMS microphone 1. This output signal is preferably a digital signal. Preferably, the output signal is a digital single-bit signal. Accordingly, the second part 4 may process the signal provided by the first part 3 by converting it into a digital single-bit signal. Further, the second part 4 may process the signal provided by the first part 3 by amplifying the signal.

The second part 4 has an adjustable gain setting. This gain setting may correspond to the amplification factor by which the amplitude of the processed signal is amplified. The gain setting may also correspond to a setting of a full scale range of the second part.

The gain setting of the second part 4 is set to a factor given by parameter A2. The product of the parameters A1 and A2 may be constant. Thus, the gain setting A2 of the second part 4 is reciprocally proportional to the gain setting A1 of the first part 3. Accordingly, any adjustments of the gain setting A1 of the first part 3 are compensated in the second part 4, thereby providing a linear input-output relationship of the MEMS microphone 1.

In other words, independently of the setting of the parameter A1, the output signal of the MEMS microphone 1 is proportional to the input signal measured by the transducer element 2 as the gain setting of the first part 3 given by parameter A1 and the gain setting of the second part 4 given by parameter A2 are amended such that the product of the parameters A1 and A2 remains constant. Accordingly, it may be chosen from a wide variety of gain settings for the first part 3 as the adjustable gain setting of the second part 4 allows compensating for any changes in the gain setting of the first part 3.

The MEMS microphone 1 further comprises the gain control unit 5 which is enabled to adjust the gain settings of the first and the second part 3, 4. The processed signal which is provided by the first part 3 is also fed into the gain control unit 5 as an input parameter. Based on the amplitude of this signal, the gain control unit 5 is enabled to change the gain settings of the first and the second part 3, 4. Accordingly, the gain control unit 5 is connected to the first part 3 and to the second part 4. Further, the gain control unit 5 is enabled to send control signals to each of the first and the second part 3, 4.

The gain control unit 5 monitors the amplitude of the processed signal provided by the first part 3. If this amplitude exceeds a first threshold value, the gain control unit 5 decreases the gain setting of the first part 3 and increases the gain setting of the second part 4. The first threshold value may correspond to a certain percentage of the linearity range of the first part 3.

For example, if the amplitude of the processed signal exceeds the first threshold value, the gain control unit 5 may deduce that the electrical signal provided by the transducer element 2 to the first part 3 is exceeding a value corresponding to e.g. 70% of the linearity range of the first part 3. Accordingly, the gain control unit 5 may decrease the gain setting of the first part 3 which, in this case, corresponds to increasing the linearity range.

Thereby, a clipping of the transducer element 2 and the first part 3 is avoided, i.e. it is avoided that the electrical signal exceeds the linearity range which would result in an overflow of the first part 3. Thereby, it is ensured that the MEMS microphone 1 can operate up to a high maximum sound pressure level. In particular, the MEMS microphone 1 can be operated up to a sound pressure level of 140 dB without an overflow of any of the parts.

Further, if the amplitude of the processed signal provided by a first part 3 remains below a second threshold value for a given period of time, the gain control unit 5 increases the gain setting of the first part 3 and decreases the gain setting of the second part 4. To measure the given period of time, the gain control unit 5 comprises a timer which is not shown in the Figures. The given period of time may be in the range of milliseconds, e.g. in the range from 1 to 100 milliseconds.

If the amplitude remains below the second threshold value for this given period of time, it can be assumed that the signal amplitude has decreased and that the gain setting of the first part 3 may be increased without risking a clipping effect. Thereby, it is ensured that for weak acoustical signals having a small amplitude, the linearity range of the first part 3 and the gain setting of the first part is adapted such that a sufficient Signal-to-Noise ratio is guaranteed.

The first part 3 may comprise elements for analog processing of the signal provided by the transducer element 2. The second part 4 comprises elements for digitally processing a signal. As any gain adjustment in the first part 3 is reciprocally applied to the second part 4, any gain adjustments made by the analog elements is being compensated digitally in the second part 4. Accordingly, the output signal provided by the MEMS microphone 1 is independent of the gain settings of the first and the second part 3, 4. Thereby, a linear relationship between the amplitude of the electrical signal provided by the transducer element 2 and the output signal provided by the second part 4 is ensured.

Figure 2:
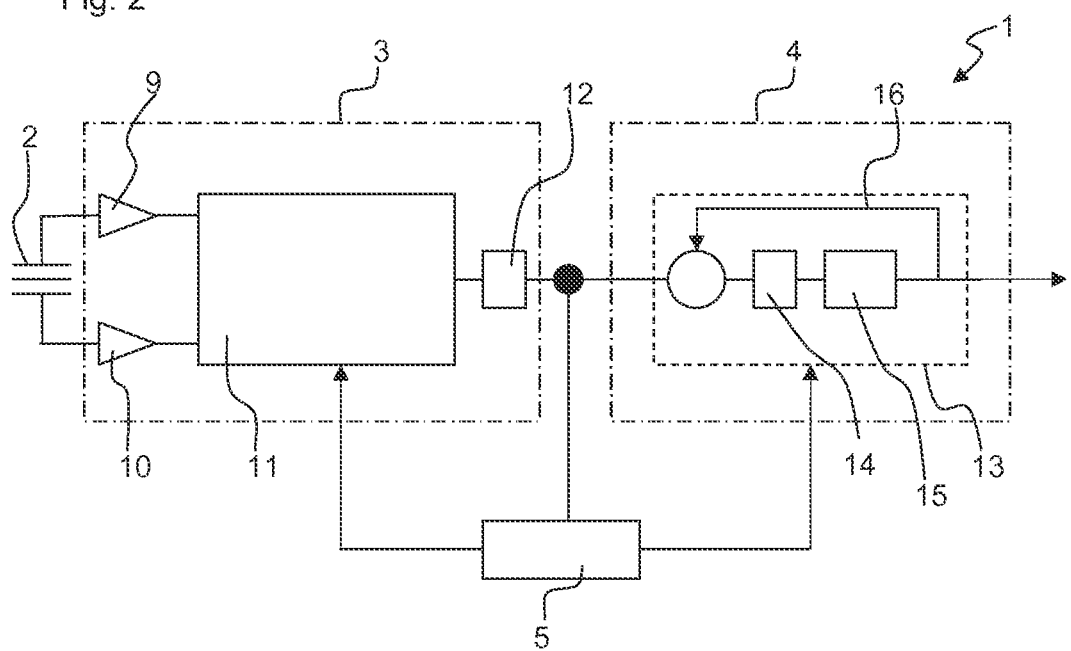
FIG. 2 shows a more detailed block diagram of a MEMS microphone according to a first embodiment.

FIG. 2 shows a more detailed block diagram of the MEMS microphone 1 according to a first embodiment.

The first part 3 comprises a first and a second preamplifier 9, 10, an Analogue-to-Digital Sigma-Delta Modulator 11 and an averaging filter 12. The averaging filter 12 is a component which converts a single-bit digital signal having a first signal rate into a multi-bit digital signal at the same rate as the input signal. For every single-bit input sample, it calculates and outputs the average of the current and previous n−1 input samples. Thus it provides an output signal having n+1 levels.

The first part 3 processes the signal provided by the transducer element 2. Thereby, the first part 3 amplifies the signal by an amplification factor given by the overall gain setting A1 of the first part.

The differential transducer element 2 provides two electrical signals. Each of said signals is fed to one preamplifier 9, 10. The first and the second preamplifier 9, 10 are arranged in parallel paths. The first and the second preamplifier 9, 10 each amplify the amplitude of the respective electrical signal and provide an analog output signal to the Analogue-to-Digital Sigma-Delta Modulator 11. The first and the second preamplifier 9, 10 preferably are set to the same gain setting such that the signal strength in both paths is identical. Alternatively, the first and the second preamplifier 9, 10 may also be set to different gain settings.

However, in an alternative embodiment, the transducer element 2 may provide only one electrical signal. In this case the first part 3 may comprise only one preamplifier 9.

The preamplifier 9 increases the amplitude of the signal by a factor $A1_{PREAMP}$. The gain setting of the preamplifiers 9, 10, i.e. the parameter $A1_{PREAMP}$, is adjustable. The gain control unit 5 is adapted to adjust the gain setting of the first and of the second preamplifier 9, 10.

Further, the Analogue-to-Digital Sigma-Delta Modulator 11 is enabled to transform the analog signals provided by the transducer element 2 into digital signals. The Analogue-to-Digital Sigma-Delta Modulator 11 has an adjustable full scale range. The parameter $A1_{SDM}$ describes the setting of the adjustable full scale range. In the first embodiment, the Analogue-to-Digital Sigma-Delta Modulator 11 provides a single-bit digital output signal. This signal is fed to the averaging filter 12 which is connected in line with the Analogue-to-Digital Sigma-Delta Modulator 11.

The overall gain setting A1 of the first part is proportional to the parameter $A1_{PREAMP}$ describing the gain of the preamplifiers 9, 10 and proportional to the parameter $A1_{SDM}$ describing the setting of the adjustable full scale range of the Analogue-to-Digital Sigma-Delta Modulator 11.

The averaging filter 12 generates a digital multi-bit signal. Accordingly, the averaging filter 12 samples the signals provided by the Analogue-to-Digital Sigma-Delta Modulator 11 over a given number of n bits and provides an output signal having n+1 levels. This digital multi-bit signal is fed to the second part 4 and to the gain control unit 5.

The gain control unit 5 monitors the output signal provided by the averaging filter 12. Based on this signal, the gain control unit 5 is enabled to set the overall gain setting A1 of the first part 3 by setting the parameter $A1_{PREAMP}$ corresponding to the gain setting of the preamplifiers 9, 10 and the parameter $A1_{SDM}$ corresponding to the full scale range setting of the Analogue-to-Digital Sigma-Delta Modulator 11.

As discussed above, the gain setting A1 of the first part 3 is decreased and the linearity range of the first part 3 is extended, if the signal provided by the averaging filter 12 exceeds a first threshold value. Further, if the signal provided by the averaging filter 12 remains below a second threshold value for a given period of time, the gain setting A1 of the first part 3 is increased and the linearity range of the first part 3 is reduced. The gain setting and the full scale range of the second part is in both cases adjusted reciprocally.

Moreover, the second part 4 comprises a digital Sigma-Delta Modulator 13. The digital Sigma-Delta Modulator 13 comprises a digital loop filter 14 and a quantizer 15. Further, the digital Sigma-Delta Modulator 13 comprises a feedback path 16.

A parameter $A_{FORWARD}$ describes the forward gain and a parameter $A_{FEEDBACK}$ describes the feedback gain of the feedback path 16. The forward gain $A_{FORWARD}$ and the feedback gain $A_{FEEDBACK}$ determine the gain of the second part $A2 = A_{FORWARD}/A_{FEEDBACK}$ and also the full scale range of the second part which is proportional to 1/A2.

The parameters $A_{FORWARD}$ and $A_{FEEDBACK}$ are adjustable. In particular, they may be adjusted by the gain control unit 5. The setting of the overall gain A2 of the second part 4 is amended by setting the parameters $A_{FORWARD}$ and $A_{FEEDBACK}$. As discussed above, the overall gain A2 of the second part 4 is amended whenever the setting of the parameters $A1_{PREAMP}$ and $A1_{SDM}$ of the first part 3 is altered. Accordingly, a change in the gain setting A1 of the first part 3 is compensated by a corresponding change in the gain setting A2 of the second part 4.

The structure of the Analogue-to-Digital Sigma-Delta Modulator 11 of the first part 3 is not shown in FIG. 2. However, the Analogue-to-Digital Sigma-Delta Modulator 11 may have a structure similar to the structure of the digital Sigma-Delta Modulator 13 shown in FIG. 2.

Figure 3:
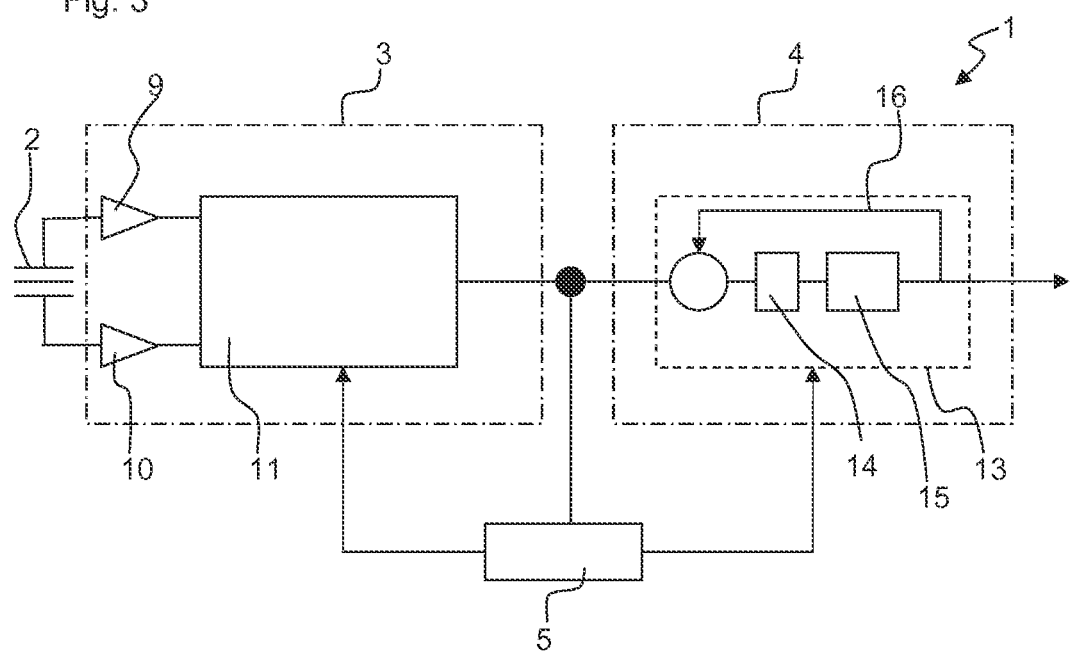
FIG. 3 shows a block diagram of a MEMS microphone according to a second embodiment.

FIG. 3 shows a second embodiment of the MEMS microphone 1. The second embodiment differs from the first embodiment in that the Analogue-to-Digital Sigma-Delta Modulator 11 provides a multi-bit output signal. Therefore, the averaging filter 12 is not needed anymore to convert a single-bit signal into a multi-bit signal. Other than that, the second embodiment is identical to the first embodiment.

In every embodiment, the Analogue-to-Digital Sigma-Delta Modulator 11 of the first part 3 can be of the type switched capacitor or continuous type. Further, it can provide a single-bit signal as shown in FIG. 2 or a multi-bit signal as shown in FIG. 3. Further, the digital Sigma-Delta Modulator 13 of the second part 4 provides a single-bit output signal. The loop filter 14 must be implemented with a sufficiently large number of bits to achieve a dynamic range that is bigger than the required system dynamic range which may be up to 112 dB.

REFERENCE NUMERALS

1—MEMS microphone
2—transducer element
3—first part
4—second part
5—gain control unit
6—diaphragm
7—first backplate
8—second backplate
9—first preamplifier
10—second preamplifier
11—Analogue-to-Digital Sigma-Delta Modulator
12—averaging filter
13—digital Sigma-Delta Modulator
14—digital loop filter
15—quantizer
16—feedback path

I claim:

1. MEMS Microphone comprising,
a transducer element for providing an electrical signal,
a first circuit configured to receive the electrical signal from the transducer element and to provide a processed signal,
a second circuit configured to receive the processed signal from the first circuit and to provide an output signal of the MEMS microphone, and
a gain control unit that is enabled to adjust a gain setting of the first circuit and to adjust a gain setting of the second circuit,
wherein the first circuit is configured to amplify the electrical signal by an amplification factor A1,
wherein the second circuit is configured to amplify the processed signal by an amplification factor A2,
wherein the gain control unit is enabled to adjust the gain setting of the first circuit by amending the amplification factor A1 and to adjust the gain setting of the second circuit by amending the amplification factor A2,
wherein the gain control unit is configured to adjust the gain settings such that a product of the amplification factors A1 and A2 remains constant.

2. MEMS microphone according to claim 1,
wherein the gain control unit is enabled to adjust the gain setting of the first circuit reciprocally proportional to the adjustment of the gain setting of the second circuit.

3. MEMS microphone according to claim 1,
wherein the first circuit comprises an Analogue-to-Digital Sigma-Delta Modulator having an adjustable gain setting.

4. MEMS microphone according to claim 3,
wherein the adjustment of the gain setting of the Analogue-to-Digital Sigma-Delta Modulator comprises changing the full scale range of the Analogue-to-Digital Sigma-Delta Modulator.

5. MEMS microphone according to claim 1,
wherein the first circuit comprises an preamplifier having an adjustable gain setting.

6. MEMS microphone according to claim 1,
wherein the second circuit comprises a digital Sigma-Delta Modulator having an adjustable gain setting.

7. MEMS microphone according to claim 6,
wherein the adjustment of the gain setting of the digital Sigma-Delta Modulator comprises changing the full scale range of the digital Sigma-Delta Modulator.

8. MEMS microphone according to claim 1,
wherein the transducer element is a differential transducer element for providing two electrical signals to the first circuit.

9. MEMS microphone according to claim 1,
wherein the gain control unit is enabled to monitor the amplitude of the processed signal provided by the first circuit and to adjust the gain settings of the first circuit and of the second circuit based on the amplitude of the processed signal provided by the first circuit.

10. MEMS microphone according to claim 1,
wherein the electrical signal provided by the transducer element is an analogue signal and
wherein the first circuit converts this signal such that the processed signal is a digital signal.

11. MEMS microphone according to claim 10,
wherein the processed signal provided by the first circuit is a digital multi-bit signal and the second circuit converts this signal into a digital single-bit signal.

12. Method of operating an MEMS microphone,
the MEMS microphone comprising
a transducer element for providing an electrical signal,
a first circuit configured to receive the electrical signal from the transducer element and to provide a processed signal,
a second circuit configured to receive the processed signal from the first circuit and to provide an output signal of the MEMS microphone, and
a gain control unit,
wherein the method comprises:
adjusting a gain setting of the first circuit and adjusting a gain setting of the second circuit,
amplifying by the first circuit the electrical signal by an amplification factor A1,
amplifying by the second circuit the processed signal by an amplification factor A2,
adjusting by the gain control unit the gain setting of the first circuit by amending the amplification factor A1 and adjusting the gain setting of the second circuit by amending the amplification factor A2, and adjusting by the gain control unit the gain settings such that a product of the amplification factors A1 and A2 remains constant.

13. Method according to claim 12, wherein the adjustment of the gain setting of the first circuit is performed reciprocally proportional to the adjustment of the gain setting of the second circuit.

14. Method according to claim 12, wherein the gain control unit monitors the amplitude of the processed signal provided by the first circuit and adjusts the gain settings of the first circuit and of the second circuit based on the amplitude of the processed signal provided by the first circuit.

15. Method according to claim 14, wherein, if the amplitude exceeds a first threshold value, the gain control unit decreases the gain settings of the first circuit and increases the gain setting of the second circuit.

16. Method according to claim 14, wherein, if the amplitude remains below a second threshold value for a given period of time, the gain control unit increases the gain settings of the first circuit and decreases the gain setting of the second circuit.

17. MEMS microphone according to claim 2, wherein the gain control unit is enabled to monitor the amplitude of the processed signal provided by the first circuit and to adjust the gain settings of the first circuit and of the second circuit based on the amplitude of the processed signal provided by the first circuit.

18. MEMS microphone according to claim 2, wherein the transducer element is a differential transducer element for providing two electrical signals to the first circuit.

19. MEMS microphone according to claim 3, wherein the second circuit comprises a digital Sigma-Delta Modulator having an adjustable gain setting.

* * * * *